(12) United States Patent
Qin et al.

(10) Patent No.: US 10,761,631 B2
(45) Date of Patent: Sep. 1, 2020

(54) FORCE TOUCH DISPLAY PANEL, METHOD FOR FABRICATING THE SAME, AND FORCE TOUCH DISPLAY DEVICE

(71) Applicant: BOE Technology Group Co., Ltd., Beijing (CN)

(72) Inventors: Yunke Qin, Beijing (CN); Xue Dong, Beijing (CN); Zhifu Li, Beijing (CN); Haisheng Wang, Beijing (CN); Chunwei Wu, Beijing (CN); Yingming Liu, Beijing (CN); Wei Liu, Beijing (CN); Yuzhen Guo, Beijing (CN); Changfeng Li, Beijing (CN); Lin Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 16/132,759

(22) Filed: Sep. 17, 2018

(65) Prior Publication Data

US 2019/0102018 A1    Apr. 4, 2019

(30) Foreign Application Priority Data

Sep. 29, 2017    (CN) .......................... 2017 1 0909413

(51) Int. Cl.
| | |
|---|---|
| G09G 3/36 | (2006.01) |
| G06F 3/041 | (2006.01) |
| H01L 27/32 | (2006.01) |
| G06F 3/044 | (2006.01) |
| G06F 3/042 | (2006.01) |

(52) U.S. Cl.
CPC ............ *G06F 3/0412* (2013.01); *G06F 3/042* (2013.01); *G06F 3/0414* (2013.01); *G06F 3/0416* (2013.01); *G06F 3/0443* (2019.05); *H01L 27/323* (2013.01); *G06F 3/04144* (2019.05); *G06F 2203/04103* (2013.01); *G06F 2203/04105* (2013.01)

(58) Field of Classification Search
CPC ........ G06F 3/041–0428; G06F 3/0488–04886; G06F 2203/04103–04113
See application file for complete search history.

(56) References Cited

U.S. PATENT DOCUMENTS

| | | | | |
|---|---|---|---|---|
| 2003/0098858 | A1* | 5/2003 | Perski | .................. G06F 3/0416 345/173 |
| 2017/0371462 | A1* | 12/2017 | Kim | ..................... G06F 3/0412 |
| 2018/0095582 | A1* | 4/2018 | Hwang | ................. G06F 3/0416 |

* cited by examiner

*Primary Examiner* — Sanghyuk Park
(74) *Attorney, Agent, or Firm* — Arent Fox LLP; Michael Fainberg (57) ABSTRACT

The disclosure discloses a touch display panel, a method for fabricating the same, and a touch display device. The touch display panel includes a base substrate, and light emitting elements arranged in an array above the base substrate, and the touch display panel further includes: sensing components arranged above the base substrate including the light emitting elements, where the sensing components include a pressure detection component and a touch detection component; and orthographic projections of at least a part of elements in the pressure detection component onto the base substrate have a non-overlapping area with orthographic projections of the light emitting elements onto the base substrate.

18 Claims, 8 Drawing Sheets

Providing the base substrate, and forming a pattern of the light emitting elements arranged in an array on the base substrate — S1201

Forming the sensing components including the pressure detection component and the touch detection component above the light emitting elements in a low-temperature process; wherein the orthographic projections of at least a part of the elements in the pressure detection component onto the base substrate have a non-overlapping area with the orthographic projections of the light emitting elements onto the base substrate — S1202

FORCE TOUCH DISPLAY PANEL, METHOD FOR FABRICATING THE SAME, AND FORCE TOUCH DISPLAY DEVICE

CROSS-REFERENCE TO RELATED APPLICATION

This Application claims priority to Chinese Patent Application No. 201710909413.5, filed on Sep. 29, 2017, the content of which is incorporated by reference in the entirety.

TECHNICAL FIELD

This disclosure relates to the field of touch control technologies, and particularly to a touch display panel, a method for fabricating the same, and a touch display device.

DESCRIPTION OF THE RELATED ART

A touch display screen has become an indispensable component to a mobile phone, a computer, or another electronic display device, and is integrated with touch and pressure (i.e. force) detectors. However if the touch and pressure detection functions are integrated in the display screen, then a cost of fabricating a display panel thereof may be increased, and an image may be hindered from being displayed normally on the display panel.

Accordingly it is highly desirable to integrate the touch and pressure detection functions in the display panel without increasing the cost of fabricating the touch display panel, and without hindering an image from being displayed on the touch display panel.

SUMMARY

Embodiments of the disclosure provide a touch display panel, a method for fabricating the same, and a touch display device.

In an aspect, the embodiments of the disclosure provide a touch display panel including a base substrate and light emitting elements arranged in an array above the base substrate, wherein the touch display panel further includes: sensing components arranged above the base substrate comprising the light emitting elements, wherein the sensing components include a pressure detection component and a touch detection component; and orthographic projections of at least a part of elements in the pressure detection component onto the base substrate have a non-overlapping area with orthographic projections of the light emitting elements onto the base substrate.

In some embodiments, at least a part of elements in the pressure detection component and/or the touch detection component are made of an organic material.

In some embodiments, the pressure detection component includes: a first transistor arranged above and insulated from the light emitting elements, a first electrode arranged above and electrically connected with the first transistor, and an organic pressure-sensitive material layer and a second electrode arranged above the first electrode; wherein orthographic projections of the first electrode, the organic pressure-sensitive material layer, and the second electrode onto the base substrate have a non-overlapping area with the orthographic projections of the light emitting elements onto the base substrate; and/or the touch detection component includes: a second transistor arranged above and insulated from the light emitting elements, and a third electrode arranged above and electrically connected with the second transistor.

In some embodiments, orthographic projections of the first transistor and the second transistor onto the base substrate have non-overlapping areas with the orthographic projections of the light emitting elements onto the base substrate.

In some embodiments, all of a gate, a source, and a drain of the first transistor and/or the second transistor are made of a transparent conductive material.

In some embodiments, an orthographic projection of the first transistor and/or an orthographic projection of the second transistor onto the base substrate have an overlapping area with the orthographic projections of the light emitting elements onto the base substrate.

In some embodiments, the first transistor is an organic thin film transistor, and/or the second transistor is an organic thin film transistor.

In some embodiments, a material of the first electrode, the second electrode, and/or the third electrode is one or a combination of molybdenum, indium tin oxide, nano-silver or graphene.

In some embodiments, the touch detection component further includes: a photosensitive material layer and a fourth electrode arranged above the third electrode in that order; and orthographic projections of the fourth electrode, the photosensitive material layer, and the third electrode onto the base substrate have a non-overlapping area with the orthographic projections of the light emitting elements onto the base substrate.

In some embodiments, the touch display panel further includes: a first insulation layer arranged between the first transistor and the first electrode, and between the second transistor and the third electrode; and a source or a drain of the first transistor is electrically connected with the first electrode through a first via hole extending through the first insulation layer; and a source or a drain of the second transistor is electrically connected with the third electrode through a second via hole extending through the first insulation layer.

In some embodiments, respective layers of the first transistor are arranged respectively in same layers as respective layers of the second transistor; and the third electrode and the first electrode are arranged in a same layer and are insulated from each other.

In some embodiments, the second electrode and the fourth electrode are arranged in a same layer and are insulated from each other.

In some embodiments, orthographic projections of the pressure detection component and the touch detection component onto the base substrate lie respectively between orthographic projections of adjacent light emitting elements onto the base substrate.

In some embodiments, the touch display panel further includes: an encapsulation layer arranged between the light emitting elements and the sensing components.

In some embodiments, the touch display panel further includes: a second insulation layer arranged above the second electrode.

In some embodiments, the touch detection component is further configured to detect a fingerprint.

In another aspect, the embodiments of the disclosure further provide a touch display device including a touch display panel; wherein the touch display panel includes a base substrate and light emitting elements arranged in an array above the base substrate; wherein the touch display panel further includes: sensing components arranged above the base substrate comprising the light emitting elements, wherein the sensing components include a pressure detection component and a touch detection component; and orthographic projections of at least a part of elements in the pressure detection component onto the base substrate have a non-overlapping area with orthographic projections of the light emitting elements onto the base substrate.

In still another aspect, the embodiments of the disclosure further provide a method for fabricating the touch display panel according to the embodiments of the disclosure, the method includes providing the base substrate, and forming a pattern of the light emitting elements arranged in an array on the base substrate; wherein the method further includes: forming the sensing components including the pressure detection component and the touch detection component above the light emitting elements in a low-temperature process; wherein the orthographic projections of at least a part of the elements in the pressure detection component onto the base substrate have a non-overlapping area with the orthographic projections of the light emitting elements onto the base substrate.

In some embodiments, forming the sensing components above the light emitting elements in the low-temperature process includes: forming a first transistor and a second transistor insulated from the light emitting elements above the light emitting elements in the low-temperature process; forming a first electrode electrically connected with the first transistor above the first transistor, and forming a third electrode electrically connected with the second transistor above the second transistor; and forming an organic pressure-sensitive material layer and a second electrode above the first electrode sequentially, wherein orthographic projections of the first electrode, the organic pressure-sensitive material layer, and the second electrode onto the base substrate have a non-overlapping area with the orthographic projections of the light emitting elements onto the base substrate.

In some embodiments, forming the sensing components above the light emitting elements in the low-temperature process further includes: forming a photosensitive material layer and a fourth electrode above the third electrode; wherein orthographic projections of the fourth electrode, the photosensitive material layer, and the third electrode onto the base substrate have a non-overlapping area with the orthographic projections of the light emitting elements onto the base substrate.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In order to make the objects, features, and advantages above of the disclosure more apparent and readily understood, the disclosure will be described below in further details with reference to the drawings and the embodiments thereof. However the exemplary embodiments can be implemented in a number of forms, and shall not be construed as being limited to the embodiments described here; and on the contrary, these embodiments are provided to make the content of the disclosure more full and complete, and to completely convey the idea of the embodiments to those skilled in the art. Like reference numerals in the drawings refer to identical or similar structures, so a repeated description thereof will be omitted. All the terms as described in the disclosure to represent positions and directions will be described by way of an example with reference to the drawings, but can also be varied as needed without departing from the scope of the disclosure as claimed. The drawings of the disclosure are merely intended to illustrate relative positional relationships, and thicknesses of some components may be exaggerated in the drawings for the sake of convenient understanding, but the thicknesses in the drawings may not indicate any proportional relationships between the real thicknesses.

It shall be noted that particular details will be set forth in the following description to facilitate full understanding of the disclosure. However the disclosure can be embodied in a number of other embodiments than those described here, and those skilled in the art can generalize them without departing from the spirit of the disclosure. Accordingly the disclosure will not be limited to the embodiments to be disclosed below. For example, some words may be used in the description and the claims to refer to specific components. Those skilled in the art shall appreciate that hardware manufacturers may denominate the same component using different names. In the description and the claims, the components will not be distinguished using their different names, but will be distinguished using their different functions. For example, "include" or "comprise" or a variant thereof as referred to throughout the description and the claims is an open term, and thus shall be construed as "include but will not be limited to". Embodiments of the disclosure will be described below merely for the purpose of setting forth the general principle of the disclosure, but not for limiting the scope of the disclosure thereto. The scope of the disclosure as claimed shall be as defined in the appended claims. It shall be appreciated that if one element, e.g., a layer, a film, an area, or a substrate, is referred to as being "on" another element, then the element may be directly on the other element, or there may be one or more elements arranged between them.

The embodiments of the disclosure provide a touch display panel, a method for fabricating the same, and a touch display device so as to integrate the pressure (i.e. force), touch and fingerprint detection functions in the display panel without increasing the cost of fabricating the touch display panel, and without hindering an image from being displayed on the touch display panel.

The touch display panel in the embodiments of the disclosure is a liquid crystal display panel, or an organic light-emitting diode display panel, although the embodiments of the disclosure will not be limited thereto. A transistor structured with a bottom gate in the embodiments of the disclosure will be described by way of an example, but the transistor will not be limited thereto, and can alternatively be structured with a top gate.

A touch display panel which is an organic light-emitting diode display panel will be described below by way of an example. The same description will equally apply to a liquid crystal display panel.

Figure 1:
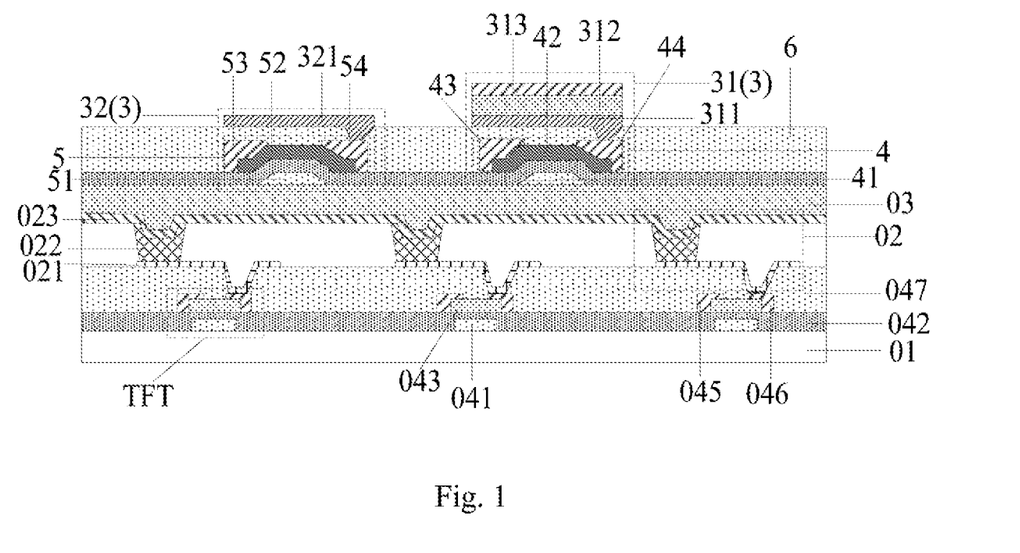
FIG. 1 is a first schematic structural diagram of a touch display panel according to the embodiments of the disclosure.

Referring to FIG. 1, a touch display panel according to the embodiments of the disclosure includes a base substrate 01, and light emitting elements 02 arranged in an array above the base substrate 01; and the touch display panel further includes sensing components 3 arranged above the base substrate 01 including the light emitting elements 02, where the sensing component 3 include a pressure detection component 31 and a touch detection component 32; and orthographic projections of at least a part of elements in the pressure detection component 31 onto the base substrate 01 have a non-overlapping area with orthographic projections of the light emitting elements 02 onto the base substrate 01.

It shall be noted that the light emitting elements 02 are insulated from the sensing components 3, and in order to avoid the light emitting elements 02 from being oxidized, in some embodiments, an encapsulation layer 03 is arranged between the light emitting elements 02 and the sensing components 3. And in some embodiments, the encapsulation layer 03 is an encapsulation layer composed of an organic layer and an inorganic layer stacked over each other, although the embodiments of the disclosure will not be limited thereto.

In some embodiments, Thin Film Transistors (TFTs) are arranged in an array between the base substrate 01 and the light emitting elements 02, and each of the Thin Film Transistors (TFTs) includes a gate 041, a gate insulation layer 042, and an active semiconductor layer 043 arranged on the base substrate 01 in that order, where the active semiconductor layer includes a source area and a drain area formed by doping N-type impurity ions or P-type impurity ions, and a channel area, which is not doped with any impurities, located between the source area and the drain area; where patterns of a source 045 and a drain 046 are formed on the active semiconductor layer 043, and the source 045 and the drain 046 are electrically connected with the source area and the drain area in the active semiconductor layer respectively.

In some embodiments, the touch display panel further includes: a passivation layer 047 arranged between the light emitting elements 02 and the source 045; and each of the light emitting elements 02 includes a first electrode layer 021, a light emitting layer 022 and a second electrode layer 023, arranged above the passivation layer 047 in that order. Where the first electrode layer 021 is electrically connected with a corresponding source 045 or a corresponding drain 046 through a contact hole in the passivation layer 047 (the first electrode layer 021 is electrically connected with a corresponding drain 046 as illustrated in FIG. 1).

Here the light emitting layer is made of an organic material with a low molecular weight, or a high molecular material; and the light emitting layer includes an organic emitting layer, and further includes at least one of a Hole Injection Layer (HIL), a Hole Transmission Layer (HTL), an Electron Transmission Layer (ETL), and an Electronic Injection Layer (EIL). Where the first electrode layer and the second electrode layer are transparent electrodes or reflecting electrodes. And when the first electrode layer is a transparent electrode, it can be made of Indium Tin Oxide (ITO), Indium Zinc Oxide (IZO), Zinc Oxide (ZnO), Indium Oxide ($In_2O_3$), etc.; when the first electrode layer is a reflecting electrode, the reflecting layer can be made of Ag, Mg, Al, Pt, Pd, Au, Ni, Nd, Ir, Cr, or a mixture thereof, and ITO, IZO, ZnO or $In_2O_3$ layers can be formed on the reflecting layer. And when the second electrode layer is a transparent electrode, it can be made of Li, Ca, LiF/Ca, LiF/Al, Al, Mg, or a compound of a composition thereof, which can be deposited on the light emitting layer through evaporation, and a transparent electrode formation material, e.g., ITO, IZO, ZnO, $In_2O_3$, etc., can be deposited on the compound; and when the second electrode layer is a reflecting electrode, the second electrode layer can be formed by evaporating Li, Ca, LiF/Ca, LiF/Al, Al, Mg, or a mixture thereof on the entire surface of the base substrate.

In the embodiments of the disclosure, the sensing components 3 are arranged above the light emitting elements 02, and a part of the elements of the pressure detection component 31 in the sensing components are arranged between the light emitting elements 02, i.e., in a non-display area to thereby avoid the pressure detection component from hindering normal display of the touch display panel. That is, in the touch display panel according to the embodiments of the disclosure, the pressure detection component detects a pressure, and the touch detection component detects both a touch and a fingerprint, so that the display panel not only can be integrated with touch, fingerprint, and pressure detection, but also the components in the display panel can be simplified in structure to thereby further lower a cost of fabricating the display panel; and furthermore at least a part of the elements of the pressure detection component are arranged between the light emitting elements to thereby avoid the pressure detection component from hindering normal display of the touch display panel.

In some embodiments, in the touch display panel according to the embodiments of the disclosure, at least a part of elements in the pressure detection component and/or the touch detection component are made of an organic material. That is, in the touch display panel according to the embodiments of the disclosure, at least a part of the elements of the pressure detection component and/or the touch detection component in the sensing components are made of the organic material, and since an element of the organic material can be fabricated at low temperature, the elements in the embodiments of the disclosure can be fabricated at a lower cost than the related art in which the pressure detection component and/or the touch detection component are made of an inorganic material, to thereby further lower a cost of fabricating the display panel.

In some embodiments, in the touch display panel according to the embodiments of the disclosure, referring to FIG. 1, the pressure detection component 31 includes: a first transistor 4 arranged above and insulated from the light emitting elements 02; a first electrode 311 arranged above and electrically connected with the first transistor 4, and an organic pressure-sensitive material layer 312 and a second electrode 313 arranged above the first electrode 311. Where orthographic projections of the first electrode 311, the organic pressure-sensitive material layer 312, and the second electrode 313 onto the base substrate 01 have a non-overlapping area with the orthographic projections of the light emitting elements 02 onto the base substrate 01. That is, the pressure detection component 31 includes the first transistor 4, the first electrode 311, the organic pressure-sensitive material layer 312 and the second electrode 313, and since light is not transmitted through the organic pressure-sensitive material, in the embodiments of the disclosure, the first transistor 4, the first electrode 311, the organic pressure-sensitive material layer 312 and the second electrode 313 are arranged between the light emitting elements 02 so that the pressure detection component is arranged in the non-display area to thereby avoid normal display of the touch display panel from being affected.

Figure 2:
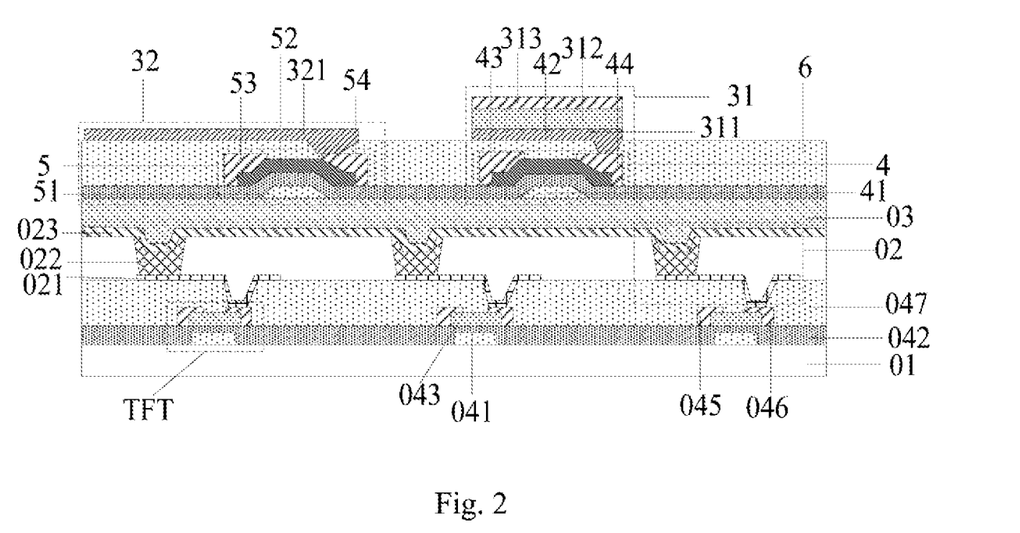
FIG. 2 is a second schematic structural diagram of a touch display panel according to the embodiments of the disclosure.

In some embodiments, referring to FIG. 1 or FIG. 2, the first transistor 4 includes a gate 41, an active layer 42, a source 43 and a drain 44.

In the pressure detection component according to the embodiments of the disclosure, the first transistor controls the pressure detection component to be enabled or disabled, the gate of the first transistor receives a first control signal transmitted by an IC, the source of the first transistor receives a first voltage signal transmitted by the IC, and the second electrode receives a second voltage signal transmitted by the IC. And when the first control signal received by the first transistor is valid, the first transistor is turned on, and the pressure detection component detects the pressure, and when the first control signal received by the first transistor is invalid, the first transistor is turned off, and the pressure detection component is disabled. Where the organic pressure-sensitive material has a high resistance when no pressure is applied thereto, and a low resistance when a pressure is applied thereto, and the resistance is reduced by a factor varying with the applied pressure. When the first control signal received by the first transistor is valid, the first transistor is turned on, the pressure detection component is enabled, and the first transistor transmits the first voltage signal for detecting the pressure to the first electrode, the second electrode receives the second voltage signal transmitted by the IC, and the voltage of the first voltage signal is different from that of the second voltage signal, so that there is a difference in voltage between the first electrode and the second electrode; and after a finger presses the touch display screen, the resistance of the organic pressure-sensitive material is reduced due to the pressure sensitivity thereof, and the resistance is reduced by a factor varying the applied pressure. For example, when the applied pressure is larger, the resistance of the organic pressure-sensitive material is lower, so that when the voltage between the first electrode and the second electrode is lower, the current between them is larger. Accordingly the IC can detect the pressure as a function of the voltage or the current between the first electrode and the second electrode.

Figure 3:
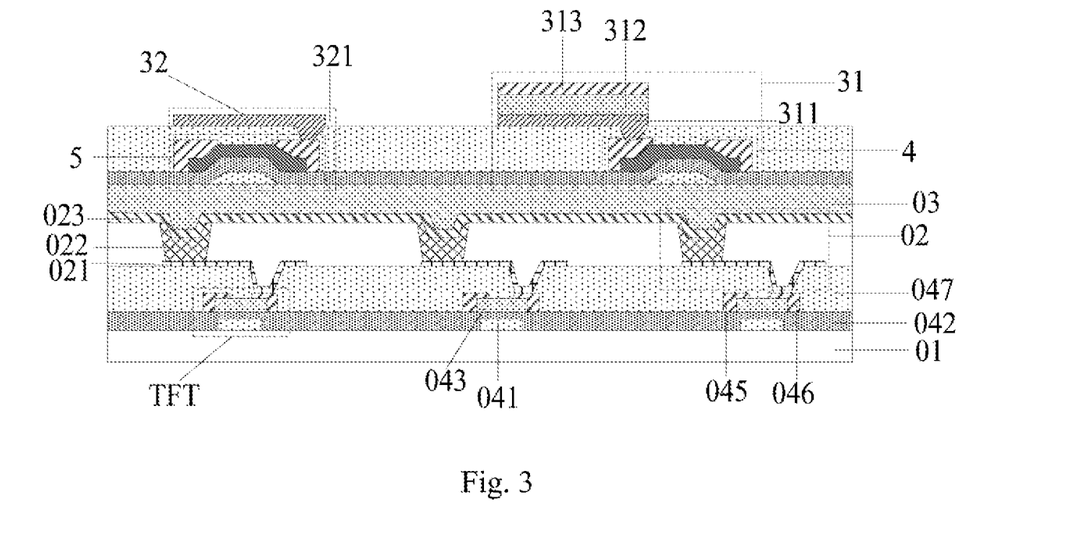
FIG. 3 is a third schematic structural diagram of a touch display panel according to the embodiments of the disclosure.

In some embodiments, in the touch display panel according to the embodiments of the disclosure, referring to FIG. 1, the touch detection component 32 includes: a second transistor 5 arranged above and insulated from the light emitting elements 02; and a third electrode 321 arranged above and electrically connected with the second transistor 5. That is, the touch detection component includes the second transistor 5 and the third electrode 321, and performs the touch and fingerprint detection functions through the third electrode 321, where FIG. 1 only illustrates the touch detection component arranged between the light emitting elements, i.e. arranged in the non-display area, by way of an example, but the embodiments of the disclosure will not be limited thereto. Alternatively as illustrated in FIG. 3, the touch detection component 32 can be arranged above the light emitting elements, and an orthographic projection of the touch detection component 32 onto the base substrate 01 has an overlapping area with the orthographic projections of the light emitting elements 02 onto the base substrate 01. Here in FIG. 3, an orthographic projection of the third electrode 321 in the touch detection component 32 onto the base substrate 01 has an overlapping area with the orthographic projections of the light emitting elements 02 onto the base substrate 01.

In some embodiments, referring to FIG. 1 or FIG. 2, the second transistor 5 includes a gate 51, an active layer 52, a source 53 and a drain 54.

In some embodiments, the touch detection component in the embodiments of the disclosure has the touch and fingerprint detection functions, where the gate of the second transistor 5 receives a second control signal transmitted by the IC, and the source of the second transistor 5 receives a third voltage signal transmitted by the IC. And when the second control signal received by the second transistor is valid, the second transistor is turned on, and the touch detection component detects the position of a touching finger, and recognizes a fingerprint; and if the second control signal received by the second transistor is invalid, the second transistor is turned off, and the touch detection component is disabled. Here the third electrode further feeds a signal in the third electrode back to the IC through a lead wire. When the second control signal received by the second transistor is valid, the second transistor is turned on, the touch detector is enabled, the second transistor transmits the third voltage signal to the third electrode, and a capacitance is generated between the third electrode and the ground; and while the finger is touching the third electrode, a part of charges in the third electrode are absorbed by the human body so that the amount of charges in the third electrode is reduced, and the capacitance between the third electrode and the ground is reduced, so the IC can determine the position of the touching finger according to the voltage or current signal fed back by the third electrode to thereby detect a touch. Since an area of a third electrode is relatively small, a plurality of third electrodes are sure to be touched by the touching finger, and since there are different distances of valleys and ridges of the fingerprint of the finger from the third electrodes, different amounts of charges in the third electrodes are taken away. For example, there is a longer distance of a finger valley from a third electrode, so a smaller amount of charges in the third electrode are taken away; and there is a shorter distance of a finger ridge from a third electrode, so a larger amount of charges in the third electrode are taken away, so that all the amounts of charges in the third electrodes touched by the finger are changed, that is, there are different capacitances between the third electrodes and the ground, where a third electrode in which the amount of charges is less changed corresponds to the position of a finger valley, and a third electrode in which the amount of charges is more changed corresponds to the position of a finger ridge, so that the fingerprint is recognized. Accordingly the touch detection component in the embodiments of the disclosure can perform the touch and fingerprint detection functions in a self-capacitive mode.

It shall be noted that the resolution of the touch display panel is very high, and when the touch detection component are arranged between the light emitting elements, an area of a third electrode is small enough for the position of a touch to be determined, and a fingerprint to be recognized, according to a change in capacitance between adjacent third electrodes. Furthermore when the touch detection component are arranged above and covers the light emitting elements, that is, a third electrode covers one or more light emitting elements, this is also enough for the position of a touch to be determined, and a fingerprint to be recognized, according to a change in capacitance between adjacent third electrodes.

In some embodiments, in the touch display panel according to the embodiments of the disclosure, referring to FIG. 1 or FIG. 2, orthographic projections of the first transistor 4 and the second transistor 5 onto the base substrate 01 have non-overlapping areas with the orthographic projections of the light emitting elements 02 onto the base substrate 01, that is, both the first transistor 4 and the second transistor 5 are arranged in the non-display area. Generally both the first transistor and the second transistor can shield light, and in order to avoid the touch detection component and the pressure detection component from hindering normal display of the touch display panel, the first transistor and the second transistor are arranged in the non-display area.

In some embodiments, in the touch display panel according to the embodiments of the disclosure, all of the gate, source and drain of the first transistor and/or the second transistor are made of a transparent conductive material. In some embodiments, in the embodiments of the disclosure, the first transistor in the pressure detection component is fabricated in a transparent structure, and/or the second transistor in the touch detection component is fabricated in a transparent structure, thus avoiding the first transistor and the second transistor from hindering normal display of the touch display panel. Accordingly the gate, the source and the drain of the first transistor are made of a transparent conductive material so that light can be transmitted through the first transistor, and the gate, the source and the drain of the second transistor are made of a transparent conductive material so that light can be transmitted through the second transistor, thus further avoiding the first transistor and the second transistor from hindering normal display of the touch display panel.

In some embodiments, if all of the gate, the source and the drain of the first transistor and/or the second transistor are made of the transparent conductive material, then the transistors in a transparent structure may be arranged in a display area. In the touch display panel according to the embodiments of the disclosure, referring to FIG. 3, the orthographic projection of the first transistor 4 onto the base substrate 01 has an overlapping area with the orthographic projections of the light emitting elements 02 onto the base substrate 01, and the orthographic projections of the first electrode 311, the organic pressure-sensitive material layer 312 and the second electrode 313 onto the base substrate 01 have a non-overlapping area with the orthographic projections of the light emitting elements 02 onto the base substrate 01; the orthographic projection of the second transistor 5 onto the base substrate 01 has an overlapping area with the orthographic projections of the light emitting elements 02 onto the base substrate 01, and the orthographic projection of the third electrode 321 onto the base substrate 01 has an overlapping area with the orthographic projections of the light emitting elements 02 onto the base substrate 01. Accordingly when both the first transistor and the second transistor are made of the transparent conductive material, the entire structure of the touch detection component can be arranged in the display area, that is, its orthographic projection can have an overlapping area with the orthographic projections of the light emitting elements onto the base substrate; and the first transistor in the pressure detection component can be arranged in the display area, that is, its orthographic projection can have an overlapping area with the orthographic projections of the light emitting elements onto the base substrate, so that the touch detection component and the pressure detection component can occupy a larger area to thereby further improve the precision of detection.

Figure 4:
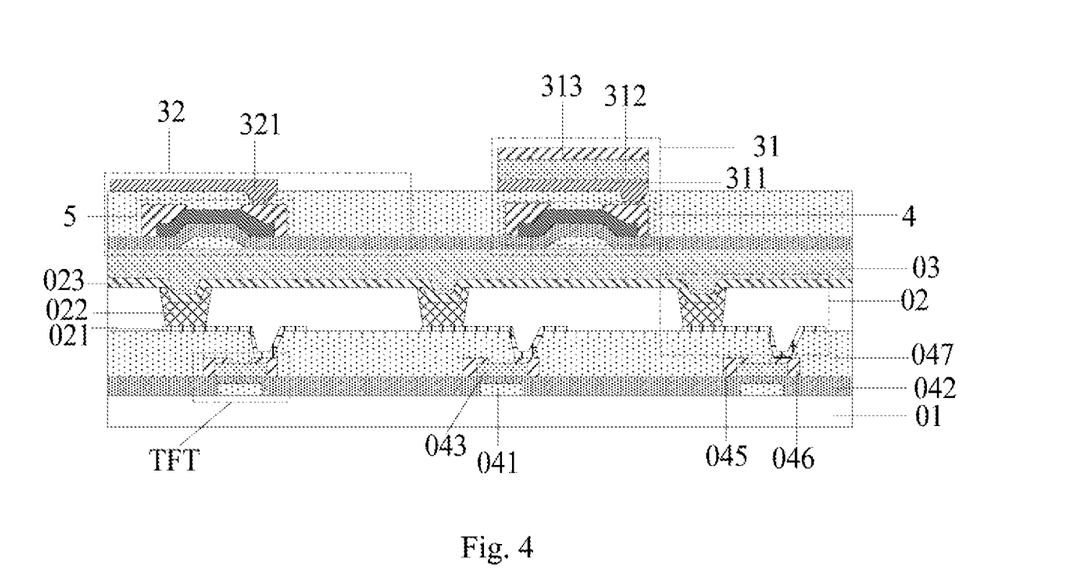
FIG. 4 is a fourth schematic structural diagram of a touch display panel according to the embodiments of the disclosure.
Figure 5:
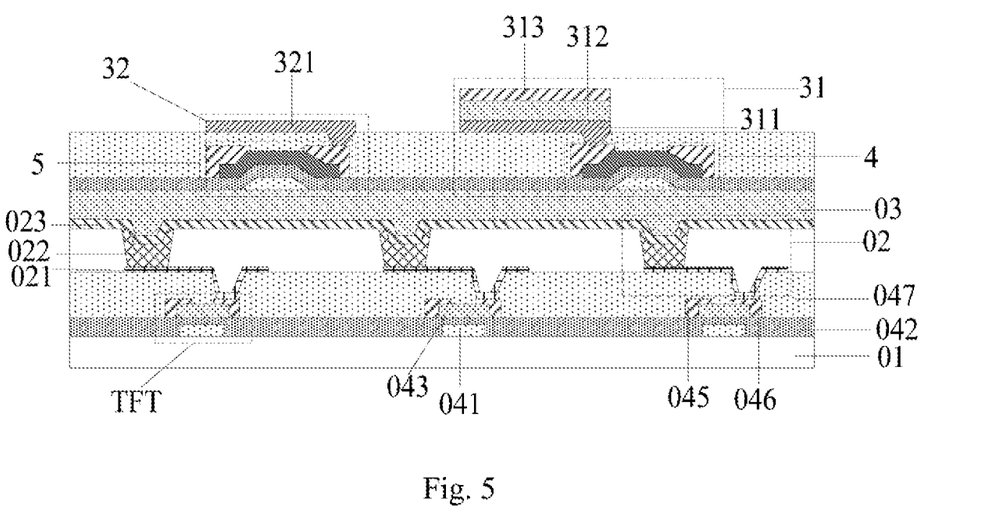
FIG. 5 is a fifth schematic structural diagram of a touch display panel according to the embodiments of the disclosure.

In some embodiments, either of the first transistor and the second transistor is arranged in the display area, and as illustrated in FIG. 4, the orthographic projection of the first transistor 4 onto the base substrate 01 has a non-overlapping area with the orthographic projections of the light emitting elements 02 onto the base substrate 01, and the orthographic projections of the first electrode 311, the organic pressure-sensitive material layer 312 and the second electrode 313 onto the base substrate 01 have an non-overlapping area with the orthographic projections of the light emitting elements 02 onto the base substrate 01; the orthographic projection of the second transistor 5 onto the base substrate 01 has an overlapping area with the orthographic projections of the light emitting elements 02 onto the base substrate 01, and the orthographic projection of the third electrode 321 onto the base substrate 01 has an overlapping area with the orthographic projections of the light emitting elements 02 onto the base substrate 01. Alternatively as illustrated in FIG. 5, the orthographic projection of the first transistor 4 onto the base substrate 01 has an overlapping area with the orthographic projections of the light emitting elements 02 onto the base substrate 01, and the orthographic projections of the first electrode 311, the organic pressure-sensitive material layer 312 and the second electrode 313 onto the base substrate 01 have a non-overlapping area with the orthographic projections of the light emitting elements 02 onto the base substrate 01; and the orthographic projection of the second transistor 5 onto the base substrate 01 has a non-overlapping area with the orthographic projections of the light emitting elements 02 onto the base substrate 01, and the orthographic projection of the third electrode 321 onto the base substrate 01 has a non-overlapping area with the orthographic projections of the light emitting elements 02 onto the base substrate 01.

In some embodiments, in the touch display panel according to the embodiments of the disclosure, all the first transistors are organic thin film transistors, and/or all the second transistors are organic thin film transistors. In some embodiments, the first transistors and the second transistors in the embodiments of the disclosure are made of an organic material as organic thin film transistors. Alternatively all the first transistors in the embodiments of the disclosure are made of an organic material, or all the second transistors in the embodiments of the disclosure are made of an organic material. For example, the transistors include active layers made of an organic polymer or a small molecule. Alternatively the transistors include gate insulation layers made of an organic material. The transistors made of an organic material can be fabricated at low temperature to thereby further lower a cost of fabricating the transistors.

In some embodiments, in the touch display panel according to the embodiments of the disclosure, the material(s) of the first electrode, the second electrode, and/or the third electrode is or are one or a combination of Mo (molybdenum), ITO, nano-silver, or graphene. The first electrode, the second electrode, and/or the third electrode made of one or a combination of Mo, ITO, nano-silver, or graphene can be fabricated in a low-temperature sputtering process to thereby further lower a fabrication cost thereof.

Figure 6:
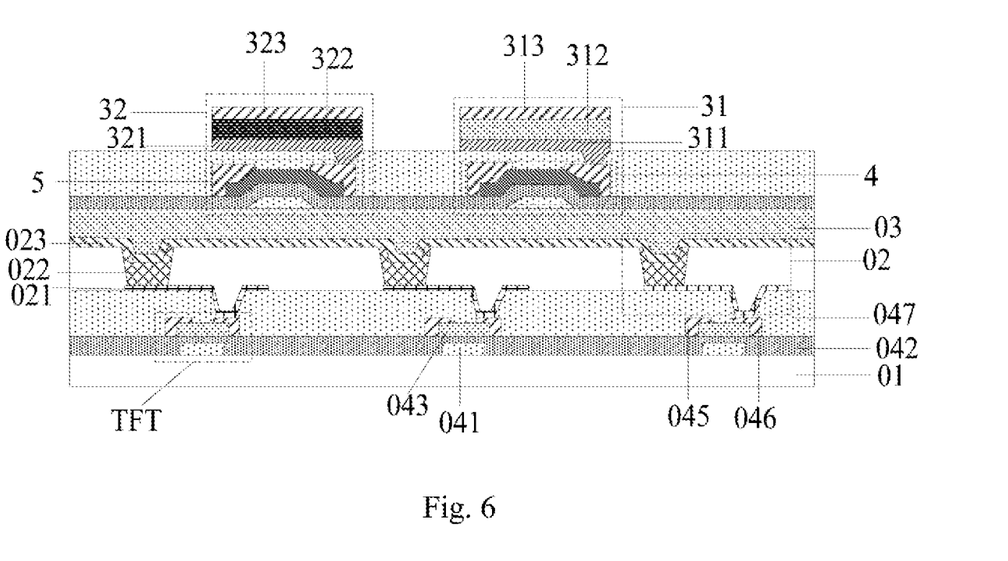
FIG. 6 is a sixth schematic structural diagram of a touch display panel according to the embodiments of the disclosure.

In some embodiments, in the touch display panel according to the embodiments of the disclosure, referring to FIG. 6, the touch detection component 32 further includes: a photosensitive material layer 322 and a fourth electrode 323 arranged above the third electrode 321 in that order; where orthographic projections of the fourth electrode 323, the photosensitive material layer 322, and the third electrode 321 onto the base substrate 01 have a non-overlapping area with the orthographic projections of the light emitting elements 02 onto the base substrate 01. In the embodiments of the disclosure, the touch detection component 32 includes the second transistor 5, the third electrode 321, the photosensitive material layer 322 and the fourth electrode 323, where the resistance of the photosensitive material layer drops rapidly while light at a specific wavelength is incident on the photosensitive material layer because all the carriers induced by the incident light participate in electrical conduction, and drift under the action of an external electric field, where electrons run toward the anode of a power source, and holes run toward the cathode of the power source, so that the resistance of the photosensitive material layer drops rapidly. Accordingly the touch detection component can detect a touch and a fingerprint in a mutual-capacitive mode as a function of the voltage or current between the third electrode and the fourth electrode.

In some embodiments, the touch detection component in the embodiments of the disclosure has the touch and fingerprint detection functions, where the gate of the second transistor 5 receives the second control signal transmitted by the IC, the source of the second transistor 5 receives the third voltage signal transmitted by the IC, and the fourth electrode receives the fourth voltage signal transmitted by the IC. When the second control signal received by the second transistor is valid, the second transistor is turned on, and the touch detection component detects the position of the touching finger, and recognizes the fingerprint; and when the second control signal received by the second transistor is invalid, the second transistor is turned off, and the touch detection component is disabled. Where the third electrode further feeds the signal in the third electrode back to the IC through a lead wire, and the fourth electrode further feeds the signal in the fourth electrode back to the IC through a lead wire. When the second control signal received by the second transistor is valid, the second transistor is turned on, the touch detection component is enabled, the second transistor transmits the third voltage signal to the third electrode, the fourth electrode receives the fourth voltage signal transmitted by the IC, and a capacitance is generated between the third electrode and the fourth electrode; while natural light is incident on the touch detection component, and there is no finger touching, the resistance of the photosensitive material layer is relatively low; and if a finger is touching the touch display panel, then the finger will shield the incident natural light so that the resistance of the photosensitive material layer increases and the capacitance between the third electrode and the fourth electrode changes, thus the touch will be detected. Furthermore there are different distances of valleys and ridges of the finger from the fourth electrode, so there is a different capacitance between the fourth electrode and the third electrode; and there are small areas of the third electrode and the fourth electrode, so a plurality of fourth electrodes are sure to be touched by the touching finger; and there are different distances of the valleys and the ridges of the finger from the fourth electrodes, so different amounts of charges in the fourth electrodes are taken away. For example, there is a longer distance of a finger valley from a fourth electrode, so a smaller amount of charges in the fourth electrode are taken away; and there is a shorter distance of a finger ridge from a fourth electrode, so a larger amount of charges in the fourth electrode are taken away, so that all the amounts of charges in the fourth electrodes touched by the finger are changed, that is, there are different capacitances between the fourth electrodes and the third electrodes, where a fourth electrode in which the amount of charges is less changed corresponds to the position of a finger valley, and a fourth electrode in which the amount of charges is more changed corresponds to the position of a finger ridge, so that the fingerprint is recognized. Accordingly the touch detection component in the embodiments of the disclosure can perform the touch and fingerprint detection functions in a mutual-capacitive mode.

In some embodiments, in the touch display panel according to the embodiments of the disclosure, referring to FIG. 1 or FIG. 2, the touch display panel further includes: a first insulation layer 6 arranged between the first transistor 4 and the first electrode 311, and between the second transistor 5 and the third electrode 321; where the source 43 or the drain 44 of the first transistor 4 is electrically connected with the first electrode 311 through a first via hole extending through the first insulation layer 6 (only the drain 44 is connected with the first electrode as illustrated in FIG. 1 or FIG. 2), and the sources 53 or the drain 54 of the second transistor 5 is electrically connected with the third electrode 321 through a second via hole extending through the first insulation layer 6 (only the drain 54 is connected with the third electrode as illustrated in FIG. 1 or FIG. 2).

In some embodiments, in the touch display panel according to the embodiments of the disclosure, respective layers of the first transistor are arranged respectively in the same layers as respective layers of the second transistor; and the third electrode and the first electrode are arranged in the same layer and are insulated from each other. In some embodiments, referring to FIG. 1 or FIG. 2, the gate 41, the active layer 42, the source 43 and the drain 44 in the first transistor 4 are arranged respectively in the same layers as the gate 51, the active layer 52, the source 53 and the drain 4 in the second transistor 5, so the first transistor and the second transistor can be fabricated at the same time to thereby simplify a fabrication process thereof where the third electrode 321 is arranged in the same layer and insulated from the first electrode 311 to thereby further simplify a fabrication process thereof.

In some embodiments, in the touch display panel according to the embodiments of the disclosure, referring to FIG. 6, the fourth electrode 323 in the touch detection component 32 and the second electrode 313 in the pressure detection component 31 are arranged in the same layer and are insulated from each other, so the second electrode and the fourth electrode can be fabricated at the same time to thereby further simplify a fabrication process thereof.

Figure 7:
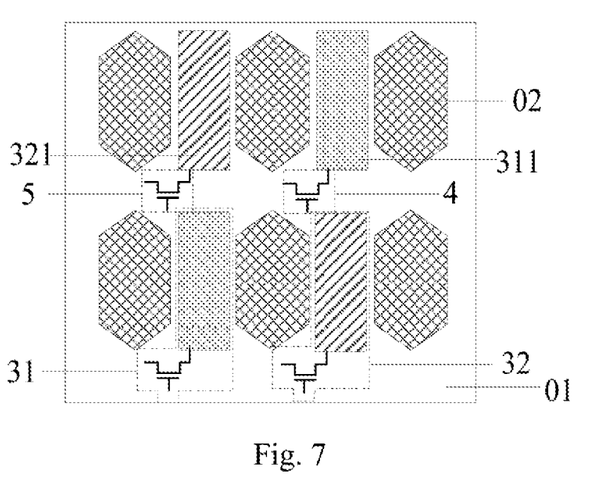
FIG. 7 is a seventh schematic structural diagram of a touch display panel according to the embodiments of the disclosure.

In some embodiments, in the touch display panel according to the embodiments of the disclosure, referring to FIG. 7, orthographic projections of the pressure detection component 31 and the touch detection component 32 onto the base substrate 01 lie respectively between orthographic projections of adjacent light emitting elements 02 onto the base substrate 01. In some embodiments, when both the first transistor and the second transistor are nontransparent transistors, all the first transistor 4, the first electrode 311, the organic pressure-sensitive material layer and the second electrode in the pressure detection component 31 are arranged between the light emitting elements 02, and all the second transistor 5 and the third electrode 321 in the touch detection component 32 are arranged between the light emitting elements 02, where all the elements in the pressure detection component and the touch detection component are arranged in the non-display area to thereby further avoid the sensing components from hindering normal display of the touch display panel.

In some embodiments, in the touch display panel according to the embodiments of the disclosure, the pressure detection component 31 and the touch detection component 32 can be arranged respectively between different light emitting elements, or between the same light emitting elements. Furthermore since the resolution of the touch display panel is relatively high, the pressure detection component and the touch detection component may be alternately arranged between the light emitting elements, but may not be arranged between the respective light emitting elements, so the pressure detection component and the touch detection component may be arranged uniformly or non-uniformly between the light emitting elements.

Figure 8:
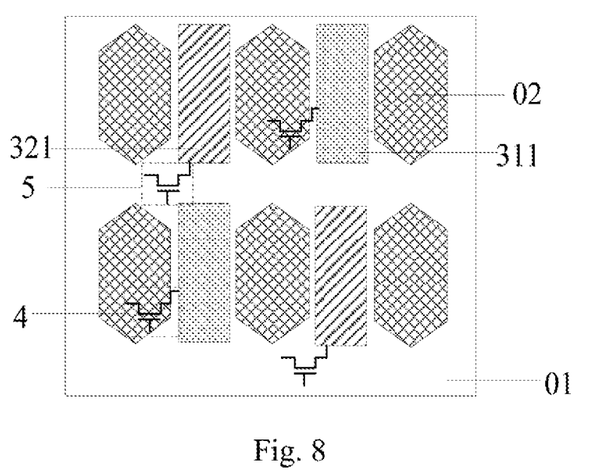
FIG. 8 is an eighth schematic structural diagram of a touch display panel according to the embodiments of the disclosure.
Figure 9:
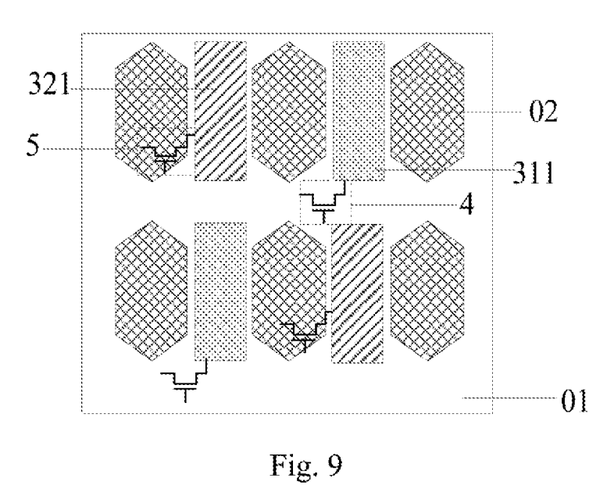
FIG. 9 is a ninth schematic structural diagram of a touch display panel according to the embodiments of the disclosure.

In some embodiments, when the first transistor and/or the second transistor are made of a transparent conductive material, the first transistor and/or the second transistor can be arranged in the display area, and as illustrated in FIG. 8, the first transistor 4 is made of a transparent conductive material, the first transistor 4 is arranged in the display area, and its orthographic projection onto the base substrate 01 has an overlapping area with the orthographic projections of the light emitting elements 02 onto the base substrate 01; or as illustrated in FIG. 9, the second transistor 5 is made of a transparent conductive material, the second transistor 5 is arranged in the display area, and its orthographic projection onto the base substrate 01 has an overlapping area with the orthographic projections of the light emitting elements 02 onto the base substrate 01.

Figure 10:
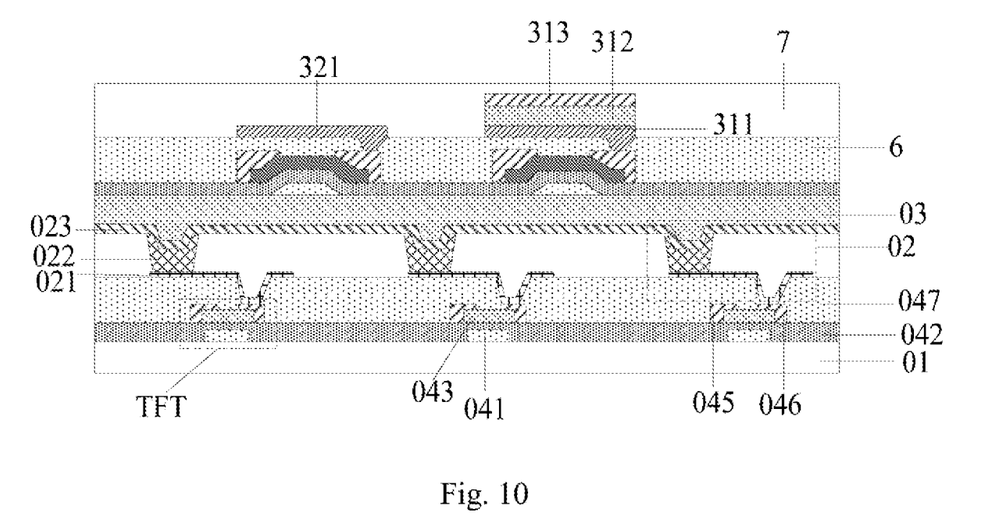
FIG. 10 is a tenth schematic structural diagram of a touch display panel according to the embodiments of the disclosure.

In some embodiments, in the touch display panel according to the embodiments of the disclosure, referring to FIG. 10, the touch display panel further includes a second insulation layer 7 arranged above the second electrode 313.

It shall be noted that the first insulation layer and the second insulation layer in the embodiments of the disclosure can be made of an organic material, and the materials of the first insulation layer and the second insulation layer may or may not be the same; and the second insulation layer further protect the sensing components.

Figure 11:
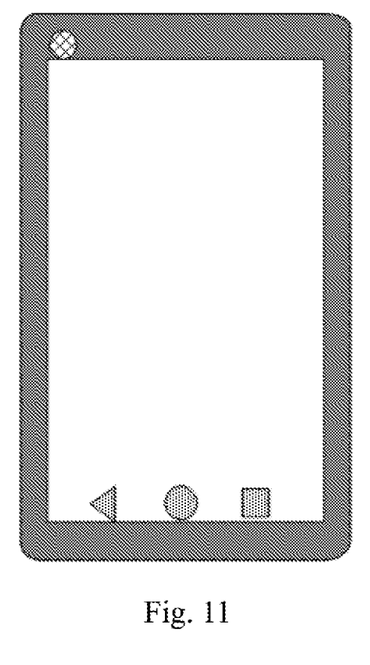
FIG. 11 is a schematic structural diagram of a touch display device according to the embodiments of the disclosure.

Based upon the same inventive concept, the embodiments of the disclosure further provide a touch display device including the touch display panel according to any one of the embodiments above of the disclosure. The touch display device can be a mobile phone (as illustrated in FIG. 11), a tablet computer, a TV set, a monitor, a notebook computer, a digital photo frame, a navigator, or any other product or component with a display function. Reference can be made to the embodiments of the touch display panel for an implementation of the touch display device, so a repeated description thereof will be omitted here.

Figure 12:
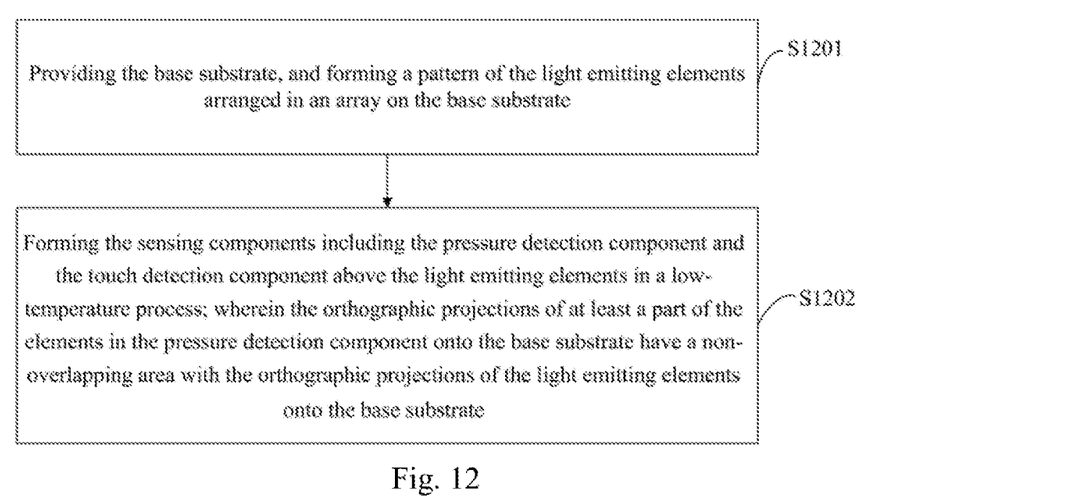
FIG. 12 is a schematic flow chart of a method for fabricating a touch display panel according to the embodiments of the disclosure.

Based upon the same inventive concept, the embodiments of the disclosure further provide a method for fabricating the touch display panel above according to the embodiments of the disclosure, and referring to FIG. 12, the method includes the following operations.

S1201 is to provide a base substrate 01, and to form a pattern of light emitting elements 02 arranged in an array on the base substrate 01.

S1202 is to form sensing components 3 including a pressure detection component 31 and a touch detection component 32 above the light emitting elements 02 in a low-temperature process; where orthographic projections of at least a part of elements in the pressure detection component 31 onto the base substrate 01 have a non-overlapping area with orthographic projections of the light emitting elements 02 onto the base substrate 01.

In some embodiments, in the method for fabricating the touch display panel according to the embodiments of the disclosure, at least a part of elements in the pressure detection component and/or the touch detection component are made of an organic material, so the pressure detection component and/or the touch detection component in the embodiments of the disclosure can be fabricated using an organic material so that the sensing components can be fabricated in a low-temperature process to thereby further lower a cost of fabricating the touch display panel.

In some embodiments, in the method for fabricating the touch display panel according to the embodiments of the disclosure, forming the sensing components 3 above the light-emitting elements 02 in the low-temperature process includes the following operations.

Figure 13A:
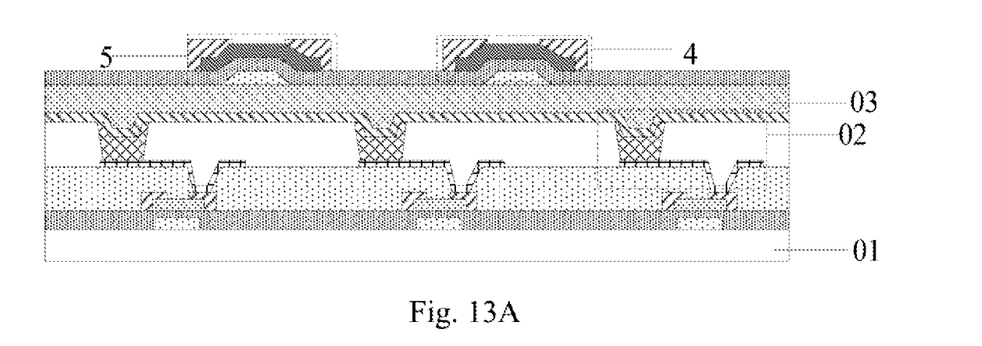
FIG. 13A to FIG. 13D are schematic structural diagrams after respective operations are performed in the method for fabricating the touch display panel according to the embodiments of the disclosure.

Forming a first transistor 4 and a second transistor 5 insulated from the light emitting elements 02 above the light emitting elements 02 in the low-temperature process as illustrated in FIG. 13A; where an encapsulation layer 03 is formed above the light emitting elements 02 before the first transistor 4 and the second transistor 5 are formed.

Figure 13B:
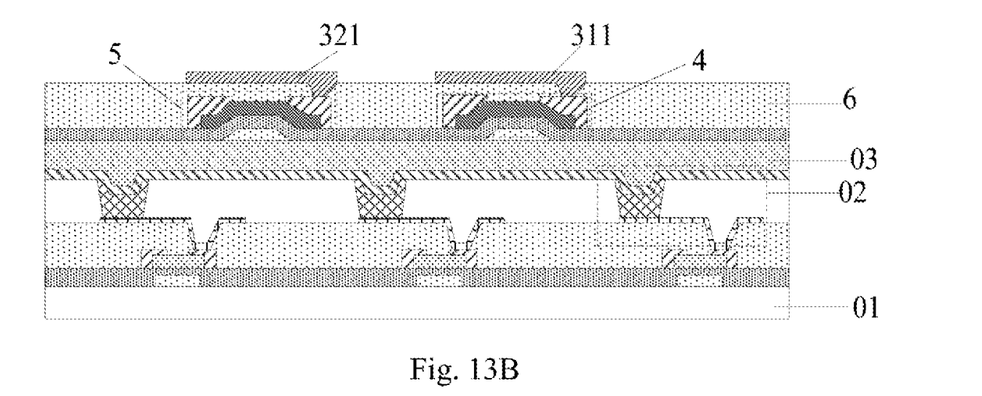

Forming a first electrode 311 electrically connected with the first transistor 4 above the first transistor 4, and forming a third electrode 321 electrically connected with the second transistor 5 above the second transistor 5 as illustrated in FIG. 13B, where a first insulation layer 6 is further formed after the first transistor 4 and the second transistor 5 are formed.

Figure 13C:
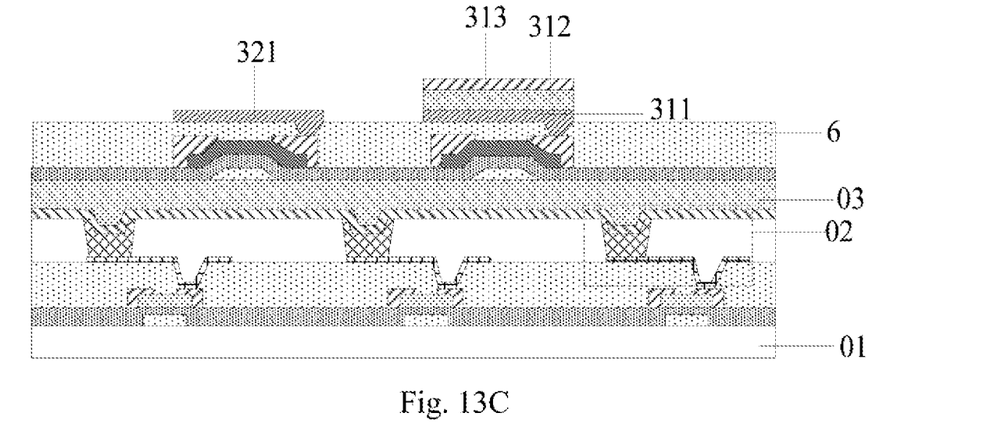

Forming an organic pressure-sensitive material layer 312 and a second electrode 313 above the first electrode 311 sequentially, where orthographic projections of the first electrode 311, the organic pressure-sensitive material layer 312, and the second electrode 313 onto the base substrate 01 have a non-overlapping area with the orthographic projections of the light emitting elements 02 onto the base substrate 01 as illustrated in FIG. 13C.

In some embodiments, in the method for fabricating the touch display panel according to the embodiments of the disclosure, forming the sensing components 3 above the light emitting elements 02 in the low-temperature process further includes the following operations.

Figure 13D:
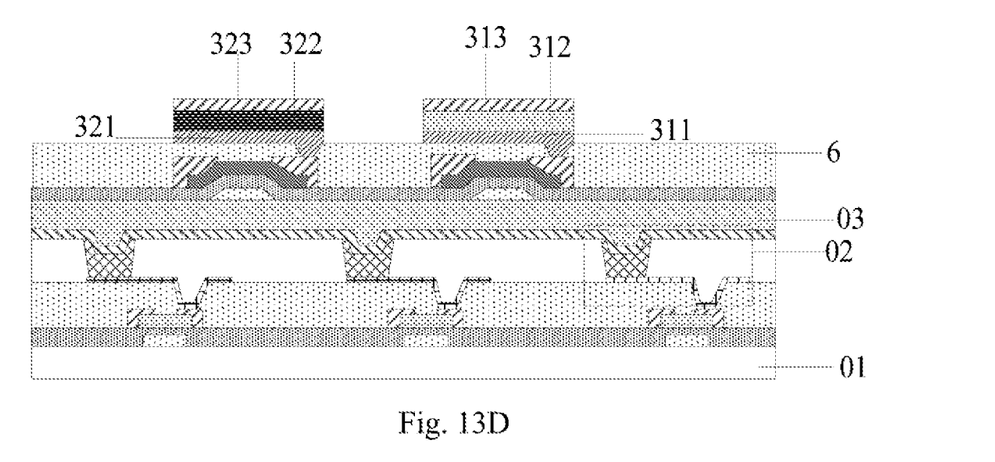

Forming a photosensitive material layer 322 located above the third electrode 321 and arranged in the same layer as the organic pressure-sensitive material layer 312, while forming the organic pressure-sensitive material layer 312; and forming a fourth electrode 323 arranged in the same layer as the second electrode 313 while forming the second electrode 313, as illustrated in FIG. 13D; where orthographic projections of the fourth electrode 323, the photosensitive material layer 322, and the third electrode 321 onto the base substrate 01 have a non-overlapping area with the orthographic projections of the light emitting elements 02 onto the base substrate 01.

It shall be noted that the organic pressure-sensitive material can be an Quantum Tunnel Compound (OTC), and the pressure-sensitive material layer can be formed through spin coating, slit coating, silk screening or printing; and when the transistors are thin film transistors, the active layers in the thin film transistors can be made of an organic polymer or a small molecule through spin coating, slit coating, silk screening or printing.

In summary, the embodiments of the disclosure provide a touch display panel, a method for fabricating the same and a touch display device, and the touch display panel includes a base substrate, and light emitting elements arranged in an array above the base substrate, and the touch display panel further includes sensing components arranged above the base substrate including the light emitting elements, where the sensing components include a pressure detection component and a touch detection component; and orthographic projections of at least a part of elements in the pressure detection component onto the base substrate have a non-overlapping area with orthographic projections of the light emitting elements onto the base substrate. Accordingly in the touch display panel according to the embodiments of the disclosure, the pressure detection component detects a pressure, and the touch detection components can detect both a touch and a fingerprint, so that the display panel not only can be integrated with touch, fingerprint, and pressure detection, but also the components in the display panel can be simplified in structure to thereby further lower a cost of fabricating the display panel; and furthermore at least a part of the elements in the pressure detection component are arranged between the light emitting elements to thereby avoid the pressure detection component from hindering normal display of the touch display panel.

Evidently those skilled in the art can make various modifications and variations to the disclosure without departing from the spirit and scope of the disclosure. Accordingly the disclosure is also intended to encompass these modifications and variations thereto so long as the modifications and variations come into the scope of the claims appended to the disclosure and their equivalents.

The invention claimed is:

1. A touch display panel, comprising: a base substrate and light emitting elements arranged in an array above the base substrate, wherein the touch display panel further comprises:
   sensing components arranged above the base substrate comprising the light emitting elements, wherein the sensing components comprise a pressure detection component and a touch detection component; and
   orthographic projections of at least a part of elements in the pressure detection component onto the base substrate have a non-overlapping area with orthographic projections of the light emitting elements onto the base substrate;
   wherein the pressure detection component comprises: a first transistor arranged above and insulated from the light emitting elements, a first electrode arranged above and electrically connected with the first transistor, and an organic pressure-sensitive material layer and a second electrode arranged above the first electrode; wherein orthographic projections of the first electrode, the organic pressure-sensitive material layer, and the second electrode onto the base substrate have a non-overlapping area with the orthographic projections of the light emitting elements onto the base substrate; and/or
   the touch detection component comprises: a second transistor arranged above and insulated from the light emitting elements, and a third electrode arranged above and electrically connected with the second transistor.

2. The touch display panel according to claim 1, wherein at least a part of elements in the pressure detection component and/or the touch detection component are made of an organic material.

3. The touch display panel according to claim 1, wherein orthographic projections of the first transistor and the second transistor onto the base substrate have non-overlapping areas with the orthographic projections of the light emitting elements onto the base substrate.

4. The touch display panel according to claim 1, wherein all of a gate, a source, and a drain of the first transistor and/or the second transistor are made of a transparent conductive material.

5. The touch display panel according to claim 4, wherein an orthographic projection of the first transistor and/or an orthographic projection of the second transistor onto the base substrate have an overlapping area with the orthographic projections of the light emitting elements onto the base substrate.

6. The touch display panel according to claim 1, wherein the first transistor is an organic thin film transistor, and/or the second transistor is an organic thin film transistor.

7. The touch display panel according to claim 1, wherein a material of the first electrode, the second electrode, and/or the third electrode is one or a combination of molybdenum, indium tin oxide, nano-silver, or graphene.

8. The touch display panel according to claim 1, wherein the touch detection component further comprises: a photosensitive material layer and a fourth electrode arranged above the third electrode in that order; and
   orthographic projections of the fourth electrode, the photosensitive material layer, and the third electrode onto the base substrate have a non-overlapping area with the orthographic projections of the light emitting elements onto the base substrate.

9. The touch display panel according to claim 8, wherein the second electrode and the fourth electrode are arranged in a same layer and are insulated from each other.

10. The touch display panel according to claim 1, wherein the touch display panel further comprises:
    a first insulation layer arranged between the first transistor and the first electrode, and between the second transistor and the third electrode; and
    a source or a drain of the first transistor is electrically connected with the first electrode through a first via hole extending through the first insulation layer; and a source or a drain of the second transistor is electrically connected with the third electrode through a second via hole extending through the first insulation layer.

11. The touch display panel according to claim 1, wherein respective layers of the first transistor are arranged respectively in same layers as respective layers of the second transistor; and
    the third electrode and the first electrode are arranged in a same layer and are insulated from each other.

12. The touch display panel according to claim 1, wherein orthographic projections of the pressure detection component and the touch detection component onto the base substrate lie respectively between orthographic projections of adjacent light emitting elements onto the base substrate.

13. The touch display panel according to claim 1, wherein the touch display panel further comprises:
   an encapsulation layer arranged between the light emitting elements and the sensing components.

14. The touch display panel according to claim 1, wherein the touch display panel further comprises:
   a second insulation layer arranged above the second electrode.

15. The touch display panel according to claim 1, wherein the touch detection component is further configured to detect a fingerprint.

16. A touch display device, comprising a touch display panel; wherein the touch display panel comprises a base substrate and light emitting elements arranged in an array above the base substrate; wherein the touch display panel further comprises:
   sensing components arranged above the base substrate comprising the light emitting elements, wherein the sensing components comprise a pressure detection component and a touch detection component; and
   orthographic projections of at least a part of elements in the pressure detection component onto the base substrate have a non-overlapping area with orthographic projections of the light emitting elements onto the base substrate;
   wherein the pressure detection component comprises: a first transistor arranged above and insulated from the light emitting elements, a first electrode arranged above and electrically connected with the first transistor, and an organic pressure-sensitive material layer and a second electrode arranged above the first electrode; wherein orthographic projections of the first electrode, the organic pressure-sensitive material layer, and the second electrode onto the base substrate have a non-overlapping area with the orthographic projections of the light emitting elements onto the base substrate; and/or
   the touch detection component comprises: a second transistor arranged above and insulated from the light emitting elements, and a third electrode arranged above and electrically connected with the second transistor.

17. A method for fabricating the touch display panel according to claim 1, the method comprises providing the base substrate, and forming a pattern of the light emitting elements arranged in an array on the base substrate; wherein the method further comprises:
   forming the sensing components comprising the pressure detection component and the touch detection component above the light emitting elements in a low-temperature process;
   wherein the orthographic projections of at least a part of the elements in the pressure detection component onto the base substrate have a non-overlapping area with the orthographic projections of the light emitting elements onto the base substrate;
   wherein forming the sensing components above the light emitting elements in the low-temperature process comprises:
   forming a first transistor and a second transistor insulated from the light emitting elements above the light emitting elements in the low-temperature process;
   forming a first electrode electrically connected with the first transistor above the first transistor, and forming a third electrode electrically connected with the second transistor above the second transistor; and
   forming an organic pressure-sensitive material layer and a second electrode above the first electrode sequentially, wherein orthographic projections of the first electrode, the organic pressure-sensitive material layer, and the second electrode onto the base substrate have a non-overlapping area with the orthographic projections of the light emitting elements onto the base substrate.

18. The method according to claim 17, wherein forming the sensing components above the light emitting elements in the low-temperature process further comprises:
   forming a photosensitive material layer and a fourth electrode above the third electrode;
   wherein orthographic projections of the fourth electrode, the photosensitive material layer, and the third electrode onto the base substrate have a non-overlapping area with the orthographic projections of the light emitting elements onto the base substrate.

* * * * *